United States Patent
Itoga et al.

(10) Patent No.: US 6,947,519 B2
(45) Date of Patent: Sep. 20, 2005

(54) X-RAY EXPOSURE APPARATUS AND METHOD, SEMICONDUCTOR MANUFACTURING APPARATUS, AND MICROSTRUCTURE

(75) Inventors: Kenji Itoga, Hyogo (JP); Shunichi Uzawa, Tokyo (JP); Yutaka Watanabe, Tochigi (JP); Toyoki Kitayama, Hyogo (JP)

(73) Assignees: Canon Kabushiki Kaisha, Tokyo (JP); Mitsubishi Denki Kabushiki Kaisha, Tokyo (JP)

( * ) Notice: Subject to any disclaimer, the term of this patent is extended or adjusted under 35 U.S.C. 154(b) by 4 days.

(21) Appl. No.: 09/951,456

(22) Filed: Sep. 14, 2001

(65) Prior Publication Data

US 2002/0048341 A1 Apr. 25, 2002

(30) Foreign Application Priority Data

Sep. 18, 2000 (JP) .................................... 2000-281862

(51) Int. Cl.⁷ ................................................ G21K 5/00
(52) U.S. Cl. ............................ 378/34; 378/35; 378/84; 378/156
(58) Field of Search ............................ 378/34, 35, 84, 378/156, 159

(56) References Cited

U.S. PATENT DOCUMENTS

| 4,110,625 A | | 8/1978 | Cairns et al. ............ 250/492 A |
| 4,634,643 A | | 1/1987 | Suzuki ............................ 430/5 |
| 5,003,567 A | * | 3/1991 | Hawryluk et al. ............. 378/34 |
| 5,012,500 A | * | 4/1991 | Watanabe et al. ............. 378/35 |
| 5,123,036 A | | 6/1992 | Uno et al. ..................... 378/34 |
| 5,125,014 A | | 6/1992 | Watanabe et al. ............. 378/34 |

(Continued)

FOREIGN PATENT DOCUMENTS

| EP | 0 597 644 A2 | 11/1993 |
| EP | 0 903 638 | 8/1998 |
| GB | 2 054 185 A | 2/1981 |
| JP | 55-71311 | 5/1980 |
| JP | 3-120714 | 5/1991 |
| JP | 6-194497 | 7/1994 |
| JP | 8-152499 | 6/1996 |
| JP | 9-218299 | 8/1997 |
| JP | 10-172883 | 6/1998 |
| JP | 11-14800 | 1/1999 |
| JP | 11-84098 | 3/1999 |
| JP | 11-160871 | 6/1999 |
| JP | 2000-156343 | 6/2000 |
| JP | 2000-338299 | 12/2000 |

OTHER PUBLICATIONS

B. D. Cullity. Elements of X–Ray Diffraction, second edition (Reading, MA: Addison–Wesley, 1978), pp. 509–511.*
International Search Report for PCT/JP00/03337, filed May 24, 2000.

(Continued)

*Primary Examiner*—Edward J. Glick
*Assistant Examiner*—Allen C. Ho
(74) *Attorney, Agent, or Firm*—Fitzpatrick, Cella, Harper & Scinto

(57) ABSTRACT

An X-ray exposure apparatus extracts exposure X-rays from light called synchrotron radiation from a synchrotron radiation source by an optical path including an X-ray mirror and performs exposure using the extracted X-rays. The X-ray mirror contains a material having an absorption edge in at least one of a wavelength range of less than 0.45 nm and a wavelength range exceeding 0.7 nm, thereby implementing exposure using the X-ray in the range of 0.45 nm to 0.7 nm. The X-ray mirror contains at least one material selected from the group consisting of iron, cobalt, nickel, copper, manganese, chromium, and their alloys, nitrides, carbides, and borides.

16 Claims, 9 Drawing Sheets

U.S. PATENT DOCUMENTS

| | | | |
|---|---|---|---|
| 5,131,022 A | 7/1992 | Terashima et al. | 378/34 |
| 5,214,685 A | 5/1993 | Howells | 378/34 |
| 5,258,091 A | 11/1993 | Imai et al. | 156/613 |
| 5,356,662 A | 10/1994 | Early et al. | 427/140 |
| 5,374,974 A | 12/1994 | Rostoker et al. | 355/71 |
| 5,444,753 A | 8/1995 | Hayashida et al. | 378/35 |
| 5,461,657 A | 10/1995 | Hayashida et al. | 378/84 |
| 5,503,958 A | 4/1996 | Waldo | 430/311 |
| 5,524,131 A | 6/1996 | Uzawa et al. | 378/34 |
| 5,528,654 A * | 6/1996 | Niibe et al. | 378/84 |
| 5,549,994 A | 8/1996 | Watanabe et al. | 430/5 |
| 5,606,586 A | 2/1997 | Amemiya et al. | 378/34 |
| 5,622,525 A | 4/1997 | Haisma et al. | 451/41 |
| 5,623,529 A * | 4/1997 | Ebinuma et al. | 378/34 |
| 5,677,939 A | 10/1997 | Oshino | 378/34 |
| 5,770,335 A | 6/1998 | Miyake et al. | 430/5 |
| 5,825,844 A | 10/1998 | Miyake et al. | 378/34 |
| 5,835,560 A | 11/1998 | Amemiya et al. | 378/34 |
| 5,923,719 A | 7/1999 | Watanabe | 378/34 |
| 5,931,723 A | 8/1999 | Katsuoka et al. | 451/285 |
| 5,949,844 A | 9/1999 | Watanabe | 378/34 |
| 5,970,114 A * | 10/1999 | Lee et al. | 378/35 |
| 6,049,588 A | 4/2000 | Cash, Jr. | 378/85 |
| 6,101,237 A | 8/2000 | Miyachi et al. | 378/35 |
| 6,167,111 A | 12/2000 | Watanabe et al. | 378/34 |
| 6,219,400 B1 | 4/2001 | Hasegawa et al. | 378/34 |
| 6,251,567 B1 | 6/2001 | Reinecke et al. | 430/325 |
| 6,256,371 B1 | 7/2001 | Hasegawa et al. | 378/34 |
| 6,366,639 B1 | 4/2002 | Ezaki et al. | 378/34 |
| 6,377,655 B1 * | 4/2002 | Murakami et al. | 378/84 |

OTHER PUBLICATIONS

Schattenburg, Mark L. and Henry I. Smith. "X–Ray Nano-lithography—the Clearest Path to 0.1 and Sub–0.1 μm USLI," JJAP Series 5, Proc. of 1991 Intern. MicroProcess Conference, pp. 63–70.

Atoda, Nobufuni. Progress of SR Lithography—A Path to 0.1 Micron Feature Size—, Tsukuba Research Laboratory, International Conference on Advanced Microelectronics Devices and Processing, Mar. 3–5, 1994, pp. 103–108.

Deguchi, Kimiyoshi. "Extendibility of synchrotron radiation lighography to the sub–100–nm region," Bulletin of Solid State Physics and Applications, vol. 5, No. 2, May 25, 1999, pp. 59–64. (Partial English translation).

Takigawa, Tadahiro, et al. "Innovation in ULSI Lithography," Science Forum, Nov. 10, 1994, pp. 220–227. (Partial English translation).

Okazaki, Shinji. "Lithography: Exposure system and resist process technology," Journal of Applied Physics, vol. 69, No.2, (2000), pp. 196–200.

Khan, M., et al. "Updated system model for x–ray lithography," J. Vac. Sci. Technol. B 12(6), Nov./Dec. 1994, pp. 3930–3935.

Deguchi, Kimiyoshi, et al. "X–ray lithography," Chapter 3, Sub–Half–Micron Lithography for ULSIs, edited by Katsumi Suzuki, et al., Cambridge University Press: 2000, pp. 66–69.

Silverman, J.P., "Performance of a wide–field flux delivery system for synchrotron x–ray lithography," J. Vac. Sci. Technol. B 11(6), Nov./Dec. 1993, pp. 2976–2980.

Hector, Scott D. and Henry I. Smith, "Simultaneous optimization of spectrum, spatial coherence, gap, feature, bias, and absorber thickness in synchrotron–based x–ray lithography," J. Vac. Sci. Technol. B 11(6), Nov./Dec. 1993, pp. 2981–2985.

Hector, Scott and Victor Pol, "X–ray lithography ≦100 nm ground rules in complex patterns," J. Vac. Sci. Technol. B 15(6), Nov./Dec. 1997, pp. 2517–2521.

Kuroda, Kenichi and Takashi Kaneko, "Mirror Design and Alignment for X–Ray Lithography Beamlines," Jpn. J. Appl. Phys. vol. 34 (1995), Part 1, No. 12B, Dec. 1995, pp. 6764–6769.

Kaneko, Takashi, et al. "High efficiency beamline for synchrotron radiation lithography," J. Vac. Sci. Technol. B 9(6), Nov./Dec. 1991, pp. 3214–3217.

Deguchi, K., et al. "Fabrication of 0.2 μm large scale integrated circuits using synchrotron radiation x–ray lithography," J. Vac. Sci. Technol. B 13(6), Nov./Dec. 1995, pp. 3040–3045.

Kikuchi, Yukiko, et al. "Replication of near 0.1 μm hole patterns by using x–ray lithography," J. Vac. Sci. Technol. B 14(6), Nov./Dec. 1996, pp. 4298–4302.

Fujii, Kiyoshi, et al. "Overlay and Critical Dimension Control in Proximity X–ray Lithography," NEC Research & Development, vol. 42, No. 1, Jan. 2001, pp. 27–31.

Shimano, Hiroki, et al. "Control of X–Ray Beam Fluctuation in Synchrotron Radiation Lithography Beamline," Jpn. J. Appl. Phys. vol. 34 (1995), Part 1, No. 10, Oct. 1995, pp. 5856–5861.

Watanabe, Yutaka, et al. "Novel illumination system of synchrotron radiation stepper with full field exposure method," J. Vac. Sci. Technol. B 15(6), Nov./Dec. 1997, pp. 2503–2508.

Sumitani, Hiroaki, et al. "Evaluation of new x–ray stepper, the XRA," J. Vac. Sci. Technol. B 19(6), Nov./Dec. 2001, pp. 2448–2454.

Ocola, L.E., "Parametric modeling at resist–substrate interfaces," J. Vac. Sci. Technol. B 12(6), Nov./Dec. 1994, pp. 3986–3989.

Ogawa, Taro, et al. "The Effects of Secondary Electrons from a Silicon Substrate on SR X–Ray Lithography," Japanese Journal of Applied Physics, vol. 28, No. 10, Oct. 1989, pp. 2070–2073.

Simon, G., et al. "Sub–20 nm x–ray nanolithography using conventional mask technologies on monochromatized synchrotron radiation," J. Vac. Sci. Technol. B 15(6), Nov./Dec. 1997, pp. 2489–2494.

Qian, Shinan, et al. "The first x–ray lithography beamline at Hefei National Synchrotron Radiation Laboratory," J. Vac. Sci. Technol. B 8(6), Nov./Dec. 1990. pp. 1524–1528.

Feldman, M. and J. Sun, "Resolution limits in x–ray lithography," J. Vac. Sci. Technol. B 10(6), Nov./Dec. 1992, pp. 3173–3176.

Goto, Shunji, et al. "Synchrotron radiation beamline for x–ray lithography," J. Vac. Sci. Technol. B 11(2), Mar./Apr. 1993, pp. 286–295.

Deguchi, Kimiyoshi, et al. "Extendibility of synchrotron radiation lithography to the sub–100 nm region," J. Vac. Sci. Technol. B 14(6), Nov./Dec. 1996, pp. 4294–4297.

Early, K., et al. "Absence Of Resolution Degradation In X–Ray Lithography For λ From 4.5 nm to 0.83 nm," Microelectronic Engineering II, Elsevier Science Publishers, B.V.: 1990, pp. 317–321.

"Lithography," International Technology Roadmap for Semiconductors, 1999 Edition, pp. 143–161.

Maldonado, J.R., et al. "X–ray lithography source using a stationary solid Pd target," J. Vac. Sci. Technol. 18(6), Nov./Dec. 1979, pp. 1942–1945.

Hosokawa, Teruo, et al. "SOR Lithography," JJAP, Series 3, Proc. of 1989 Intern. Symp. on MicroProcess Conference, pp. 72–75.

Kitayama, Toyoki, et al. "Proposal for a 50 nm proximity x–ray lithography system and extension to 35 nm by resist material selection," J. Vac. Sci. Technol. B 18(6), Nov./Dec. 2000, pp. 2950–2954.

Mizusawa, Nobutoshi, et al. "Technology and performance of the Canon XRA–1000 production x–ray stepper," J. Vac. Sci. Technol. B18(6), Nov./Dec. 2000, pp. 2955–2960.

Khan, Mumit, et al. "Extension of x–ray lithography to 50 nm with a harder spectrum," J. Vac. Sci. Technol. B 17(6) Nov./Dec. 1999, pp. 3426–3432.

Khan, Mumit, et al. "Can proximity x–ray lithography print 35 nm features? Yes," J. Vac. Sci. Technol. B 19(6), Nov./Dec. 2001, pp. 2423–2427.

Itoga, K., et al. "Effect of secondary electron from the substrate in x–ray lithography using harder radiation spectra," J. Vac. Sci. Technol. B 19(6), Nov./Dec. 2001, pp. 2439–2443.

Guo, Jerry Z.Y., et al. "Modeling X–ray proximity lithography," Journal of Research and Development, vol. 37, No. 3, May 1993, pp. 331–349.

Chen, Y., et al. "50–nm x–ray lithography using synchrotron radiation," J. Vac. Sci. Technol. B 12(6), Nov./Dec. 1994, pp. 3959–3964.

Le, Z., et al. "Theoretical calculations of a square multilayer Bragg–Fresnel lens by quantum theory," *Optics and Laser Technology*, Oct. 1999, Elsevier, U.K., vol. 31, No. 7, pp. 497–503, XP002178984.

Yaakobi, B., et al. "Laser Generated X–ray Source For Time–Resolved Biological and Material Structure Studies," Structural Biological Applications of X–ray Absorption, Scattering, and Diffraction, pp. 331–348, 1996.

Korean Office Action dated Jun. 1, 2004, issued in a corresponding Korean patent application, No. 10–2001–0057337.

\* cited by examiner

X-RAY EXPOSURE APPARATUS AND METHOD, SEMICONDUCTOR MANUFACTURING APPARATUS, AND MICROSTRUCTURE

FIELD OF THE INVENTION

The present invention relates to an X-ray exposure apparatus and a method using X-rays in the short wavelength range as exposure light, a semiconductor manufacturing apparatus, and a microstructure.

The present invention is particularly suitable for manufacturing semiconductor devices (e.g. an IC and LSI), image sensing devices (e.g., a CCD), display devices (e.g., a liquid crystal display panel), and a variety of high-resolution devices (e.g., a magnetic head) in accordance with X-ray proximity exposure techniques using X-rays as exposure light.

BACKGROUND OF THE INVENTION

Stronger demand has recently arisen for higher integration and micropatterning for a variety of devices.

Finer patterns than the conventional ones must be formed for semiconductor integrated circuits. X-ray proximity exposure techniques which use as exposure light X-rays having a shorter wavelength than that of conventional exposure light have received a great deal of attention in photolithography.

Proximity X-ray lithography has conventionally been known in which a mask pattern is transferred to a wafer by exposure, disposed near the mask, in a one-to-one size using as a light source X-rays having a wavelength of 7 to 10 Å (0.7 to 1 nm) emitted from an electron storage ring (to be referred to as an SR hereinafter) serving as a synchrotron radiation apparatus.

FIG. 9 is a view showing the arrangement of an X-ray exposure apparatus disclosed in, e.g., NTT R&D, Vol. 43, P. 501 (1994).

The X-ray exposure apparatus shown in FIG. 9 is comprised of a synchrotron radiation source 101, an X-ray mirror 103, a heat removal filter 104, a beryllium window 105, a window 122 formed from a silicon nitrite film, an X-ray mask 106, and a vertical X-Y stage 123 on which a semiconductor wafer 109 is placed. Light or synchrotron radiation 102 emitted from the synchrotron radiation source 101 passes through the X-ray mirror 103, heat removal filter 104, beryllium window 105, and window 122 formed from the silicon nitride film and reaches the X-ray mask 106. A circuit pattern to be transferred to the semiconductor wafer 109 is formed on the X-ray mask 106 from an X-ray absorber. The light 102 passes through the X-ray mask 106 to transfer the circuit pattern onto the resist applied to the semiconductor wafer 109.

The light 102 is continuous spectral light having wavelengths in the wide range from the X-ray range to the infrared range. X-rays required in the X-ray exposure process for transferring the pattern onto the semiconductor wafer 109 must have an appropriate wavelength range. For this reason, in a conventional X-ray exposure apparatus, X-ray components having wavelengths of about 0.7 nm or less are absorbed and cut using the reflection characteristics of the X-ray mirror 103. When the light 102 passes through the heat removal filter 104, most of the X-ray components of 1.5 nm or longer are absorbed and cut by the heat removal filter 104 in accordance with the properties of the beryllium material.

The wavelength of the light 102 is adjusted to fall within the range of about 0.7 to 1.5 nm. The light sequentially passes through the beryllium window 105 and window 122 formed from the silicon nitride film. In this case, almost no heat is generated by the beryllium window 105 and the window 122 formed from the silicon nitride film.

The space between the beryllium window 105 and the window 122 formed from the silicon nitride film is filled with atmospheric helium. The beryllium window 105 serves as a partition wall between the vacuum area upstream of the beryllium window 105 and the atmospheric pressure area downstream of the beryllium window 105. Unwanted X-ray components are cut by the heat removal filter 104 to suppress heat generation of the beryllium window 105. As a result, this keeps the mechanical strength of the beryllium window 105 high.

The window 122 formed from the silicon nitride film serves as a partition wall between the helium layer and outer air. When the vertical X-Y stage 123 is disposed in the helium atmosphere, the window 122 formed from the silicon nitride film can be omitted.

As described above, the circuit pattern to be transferred to the semiconductor wafer is formed on the X-ray mask 106. The predetermined area of the resist applied to the semiconductor wafer 109 is irradiated with the light 102 through the X-ray mask 106, thereby transferring this circuit pattern onto the semiconductor wafer 109.

The surface of a heavy metal such as gold or platinum has been used as the conventional material of an oblique incident mirror (X-ray mirror). This is because a reflectance of about 60% can be obtained at an exposure wavelength of 0.7 nm even if the oblique incident angle of the light 102 is set as large as about 2°. The viability of converging a larger amount of X-rays by forming an X-ray mirror having a larger convergence angle using a material such as gold or platinum has been examined.

The convergence of a larger amount of X-rays allows increasing the intensity of X-rays used in exposure. As a result, a high throughput can be obtained in the exposure process.

The use of silicon carbide or molten quartz has been proposed as the material of the X-ray mirror 103. Silicon carbide makes it possible to increase the X-ray reflectance as very high as about 90% at an X-ray wavelength of 0.7 nm or more by setting the oblique incident angle as relatively small as 1°.

A beryllium thin film is proposed as the material of the heat removal filter 104 for absorbing and cutting X-rays having longer wavelengths (wavelengths: 1.5 nm or more). A silicon nitride or diamond thin film is also proposed as an additional thin film. This thin film aims at increasing the heat absorption efficiency and preventing oxidation of the beryllium thin film.

The X-ray mask 106 is comprised of a membrane generally made of silicon carbide and an X-ray absorber formed on the membrane. Silicon carbide is used because it has a relatively small absorbance of exposure X-rays having wavelengths of about 0.7 to 1.5 nm.

As the material of an X-ray mirror surface for reflecting X-rays, gold, platinum, silicon carbide, and molten quartz are proposed. As the window material, beryllium, silicon nitride, and diamond are proposed. For any of these materials, it is assumed that X-rays having a peak wavelength of about 0.75 nm, which have been said to be optimal for X-ray exposure, are used as exposure light. The reason why X-rays having the peak wavelength of about 0.75 nm are suitable as optimal exposure light is as follows.

In principle, the shorter the X-ray wavelength, the higher the resolution of an optical image. This makes it possible to form a finer pattern. However, the shorter the X-ray wavelength, the higher the X-ray energy. When the resist applied to the semiconductor wafer 109 is irradiated with X-rays during the exposure process, photoelectrons are generated in the resist. The kinetic energy of the photoelectrons increases with an increase in incident X-ray energy.

The resist is photosensitized with the photoelectrons. When the wavelength of the X-rays becomes shorter, the resist area photosensitized with the photoelectrons generated in the resist increases. A pattern formed in the resist blurs due to the influence of the photoelectrons. That is, the range of photoelectrons determines the resolution limit.

The optimal peak wavelength of X-rays used in exposure has conventionally been said to be about 0.75 nm.

As described above, the range of photoelectrons is assumed to determine the resolution limit. In the conventional exposure process using X-rays having a peak wavelength of about 0.75 nm described above, it has been said that a pattern having a line width or line spacing of 100 nm (0.1 $\mu$m) or less cannot be formed.

Under these circumstances, in order to increase the resolutions in the X-ray exposure processes, proposals for higher resolutions have been made by using a low-contrast mask, a phase shift mask whose absorber pattern is tapered in the vertical direction, and a mask whose optical proximity effect is corrected. In any case, it is difficult to greatly increase the resolution.

A technique for shifting the wavelength of X-rays used for exposure to a shorter wavelength range and transferring a circuit pattern to obtain a higher resolution has not conventionally been examined in the technical field of semiconductor manufacturing apparatuses due to the above-mentioned problem of the range of photoelectrons. In addition, the X-rays in the shorter wavelength range are used, the X-ray energy is higher than the conventional one, so the X-rays are readily transmitted through the absorber of an X-ray mask.

To obtain necessary contrast, it is assumed that the thickness of an X-ray absorber must be increased. When X-rays pass through a transfer pattern made of an X-ray absorber having such a large thickness, the transmission characteristics of X-rays degrade due to the waveguide effect to result in a decrease in resolution of the circuit pattern to be transferred. It has conventionally been difficult to downsize the transfer pattern by shortening the X-ray wavelength.

As an exposure technique using short-wavelength X-rays, an example using an exposure wavelength of about 0.3 nm is available in the field of micromachine techniques. The use of short-wavelength X-rays aims at high-aspect patterning in which a pattern of several $\mu$m is formed at a height of several hundred $\mu$m by increasing the transmission of X-rays in the resist. The pattern size required in the field of micromachine techniques is larger than that in the field of semiconductor manufacturing apparatuses by one or two orders of magnitude.

The thickness of an X-ray absorber in an X-ray mask used in the field of micromachine techniques is larger than that in the field of semiconductor manufacturing apparatuses. In addition, an X-ray mask substrate is made of a metal such as titanium. The above technique is not to transfer an ultrafine circuit pattern and belongs to a technical field entirely different from that of the present invention. As another conventional example, an experimental sample has been reported in which a mask obtained by forming an absorber on a boron nitride substrate with gold plating is used in an exposure apparatus using an electron excitation type point source using a palladium target to perform exposure using X-rays having a wavelength range of 0.415 nm to 0.44 nm. This technique also belongs to a technical field basically different from that of the present invention using a synchrotron radiation source.

In a conventional X-ray exposure apparatus and method for forming a pattern using X-ray proximity exposure techniques, demand has arisen for widening a pattern application limit to a finer pattern range and transferring a high-resolution fine pattern onto a substrate at high speed. As problems in short-wavelength exposure in the X-ray proximity exposure techniques, fogging occurs in a resist or on a substrate due to photoelectrons and Auger electrons due to exposure light. As a result, the pattern resolution decreases to make it impossible to form finer patterns.

That is, the resolution limit is determined by the range of photoelectrons generated in the resist by exposure light, and a system having a configuration optimized on the basis of the above assumption has been employed.

In recent years, resists having a dissolution rate ratio of a resist portion influenced by photoelectrons and a resist portion directly irradiated with X-rays have been developed. In addition, necessity of micropatterns having sizes almost reaching 0.05 $\mu$m has become evident.

SUMMARY OF THE INVENTION

The present inventors found that a 50-nm line pattern could experimentally be formed using a nonchemical amplification type resist. In this case, photoelectrons blurred an optical image, but did not become a decisive factor that determines the resolution limit.

More specifically, the present inventors found that the use of a resist having a high dissolution rate ratio of a resist portion influenced by photoelectrons and a resist portion directly irradiated with X-rays did not cause the range of photoelectrons to become the main factor that determines the resolution limit. As a result, the present inventors found that X-rays in a shorter wavelength range than the conventional one could be used, as in the X-ray exposure apparatus of the present invention.

It is an object of the present invention to provide an X-ray exposure apparatus and method, which allow use of X-rays in a shorter wavelength range than a conventional one as exposure light by using an appropriate member in accordance with the above study results and to obtain higher-resolution patterns, and a device manufacturing method using the X-ray exposure apparatus and method.

It is another object of the present invention to provide an X-ray exposure system capable of using X-rays having a shorter wavelength than that of a conventional one used to obtain a higher-resolution pattern, increasing the irradiation intensity, and facilitating a high throughput.

In order to achieve the above objects, an X-ray exposure apparatus according to the present invention uses an X-ray mirror containing a material having an absorption edge in at least one of a wavelength range of less than 0.45 nm and a wavelength range exceeding 0.7 nm. In this X-ray exposure apparatus, the X-ray mirror contains at least one material selected from the group consisting of iron, cobalt, nickel, copper, manganese, chromium, and an alloy, a nitride, a carbide, and a boride thereof.

Preferably, X-rays are obtained from light emitted from a synchrotron radiation source.

Preferably, the X-ray mirror absorbs at least 90% of X-rays in a wavelength range of less than 0.3 nm.

Preferably, the substrate is exposed through an X-ray mask, the X-ray mask includes a membrane and an X-ray absorber formed on the membrane, and the membrane contains at least one material selected from the group consisting of diamond, diamond-like carbon, boron nitride, and beryllium.

Preferably, the substrate is exposed through an X-ray mask, the X-ray mask includes a membrane and an X-ray absorber formed on the membrane, the membrane contains a material having an absorption edge in at least one of a wavelength range of less than 0.45 nm and a wavelength range exceeding 0.7 nm, and the X-ray absorber contains a material having an absorption edge in a wavelength range of 0.6 nm (inclusive) to 0.85 nm (inclusive).

An X-ray exposure method according to the present invention comprises sending light onto an X-ray mirror containing a material having an absorption edge in at least one of a wavelength range of less than 0.45 nm and a wavelength range exceeding 0.7 nm, and exposing a substrate using X-rays emerging from an optical path including the X-ray mirror. In this X-ray exposure method, the X-ray mirror contains at least one material selected from the group consisting of iron, cobalt, nickel, copper, manganese, chromium, and an alloy, a nitride, a carbide, and a boride thereof.

Preferably, the light is obtained by light emitted from a synchrotron radiation source.

Preferably, the X-ray mirror includes a short-wavelength cutting X-ray mirror for absorbing at least 90% of X-rays in a range of less than 0.3 nm.

Preferably, in the exposure, the substrate is exposed through an X-ray mask, the X-ray mask includes a membrane and an X-ray absorber formed on the membrane, and the membrane contains at least one material selected from the group consisting of diamond, diamond-like carbon, boron nitride, and beryllium.

Preferably, in the exposure, the substrate is exposed through an X-ray mask, the X-ray mask includes a membrane and an X-ray absorber formed on the membrane, the membrane contains a material having an absorption edge in at least one of a wavelength range of less than 0.45 nm and a wavelength range exceeding 0.7 nm, and the X-ray absorber contains a material having an absorption edge in a wavelength range of 0.6 nm (inclusive) to 0.85 nm (inclusive).

According to the present invention, there is provided a semiconductor manufacturing apparatus for manufacturing a semiconductor device by using the above X-ray exposure method.

According to the present invention, there is provided a microstructure manufactured by using the above X-ray exposure method.

According to the present invention, there is provided a device manufacturing method of manufacturing a device using the above X-ray exposure method.

According to the present invention, there are provided an exposure apparatus and method for performing exposure using X-rays having a peak intensity profile in a wavelength range of 0.45 to 0.7 nm.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

(First Embodiment)

Figure 1:
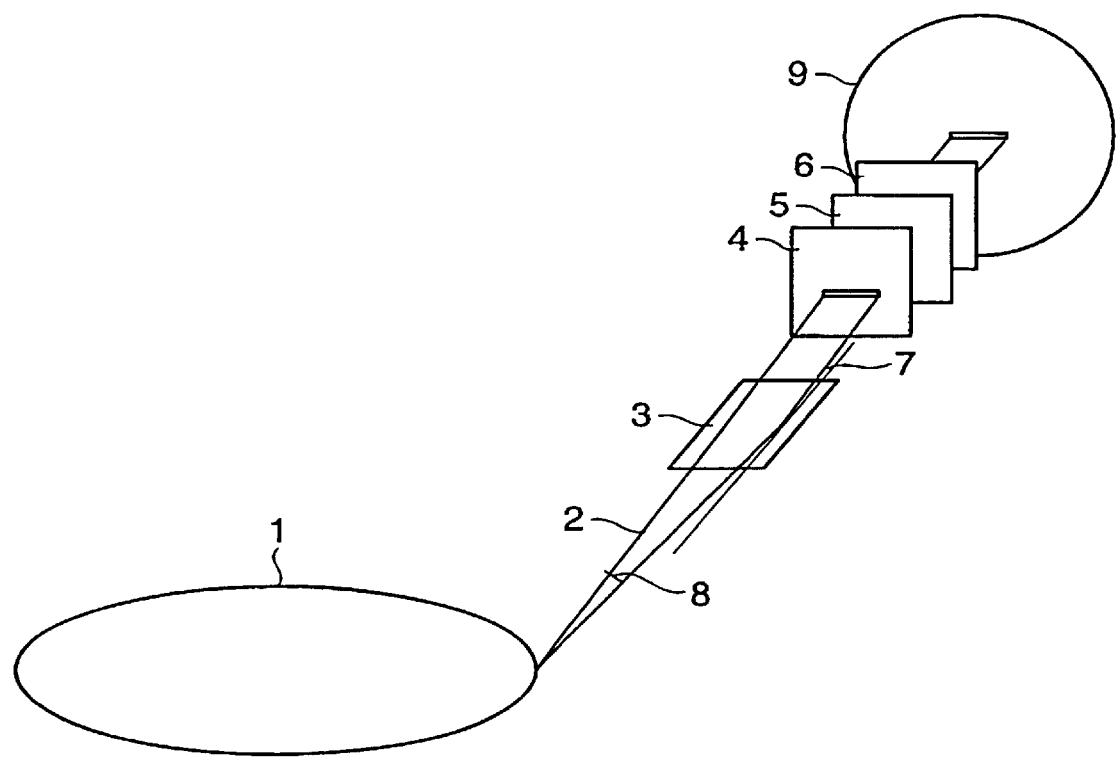
FIG. 1 is a view showing an X-ray exposure apparatus according to the first embodiment of the present invention.

The present invention incorporates an X-ray exposure apparatus and method for basically extracting optimal X-rays in a shorter wavelength range than a conventional one from a synchrotron radiation source as exposure light, irradiating an X-ray mask with the X-rays, and forming a pattern on a substrate, and an X-ray mask which is exposed to the extracted X-rays as exposure light. FIG. 1 is a view showing the X-ray exposure apparatus according to the first embodiment of the present invention. The X-ray exposure apparatus shown in FIG. 1 is comprised of a synchrotron radiation source 1 for emitting X-rays, an X-ray mirror 3 for reflecting X-rays, a heat removal filter 4, a beryllium window 5, and an X-ray mask 6 on which a pattern is formed. The heat removal filter 4 is made of beryllium and has a function of cutting X-rays in the long wavelength range of 1.5 nm or more. The beryllium window 5 serves as a partition wall between a vacuum area and an atmospheric area.

A circuit pattern to be transferred to a semiconductor wafer 9 is made of an X-ray absorber on the X-ray mask 6.

Figure 8:
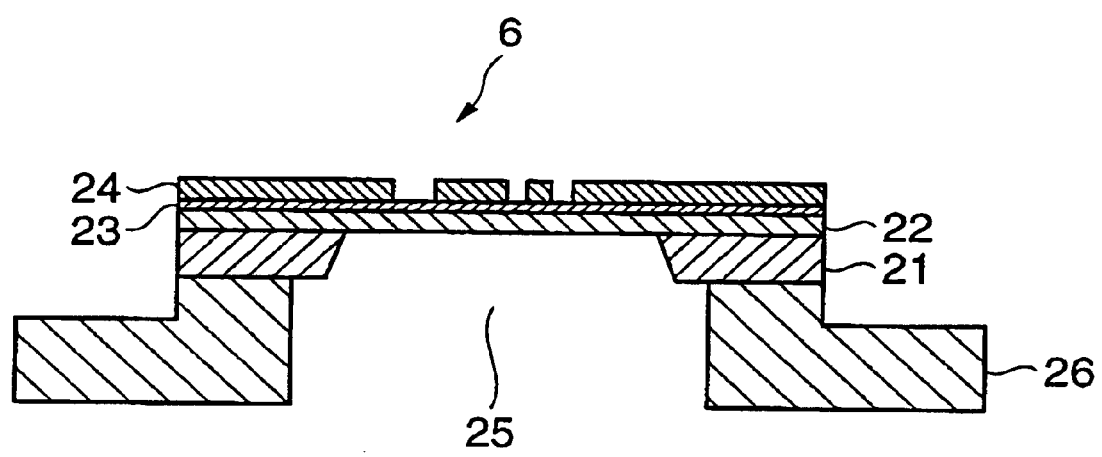
FIG. 8 is a sectional view showing the main part of an X-ray mask of the present invention.
Figure 9:
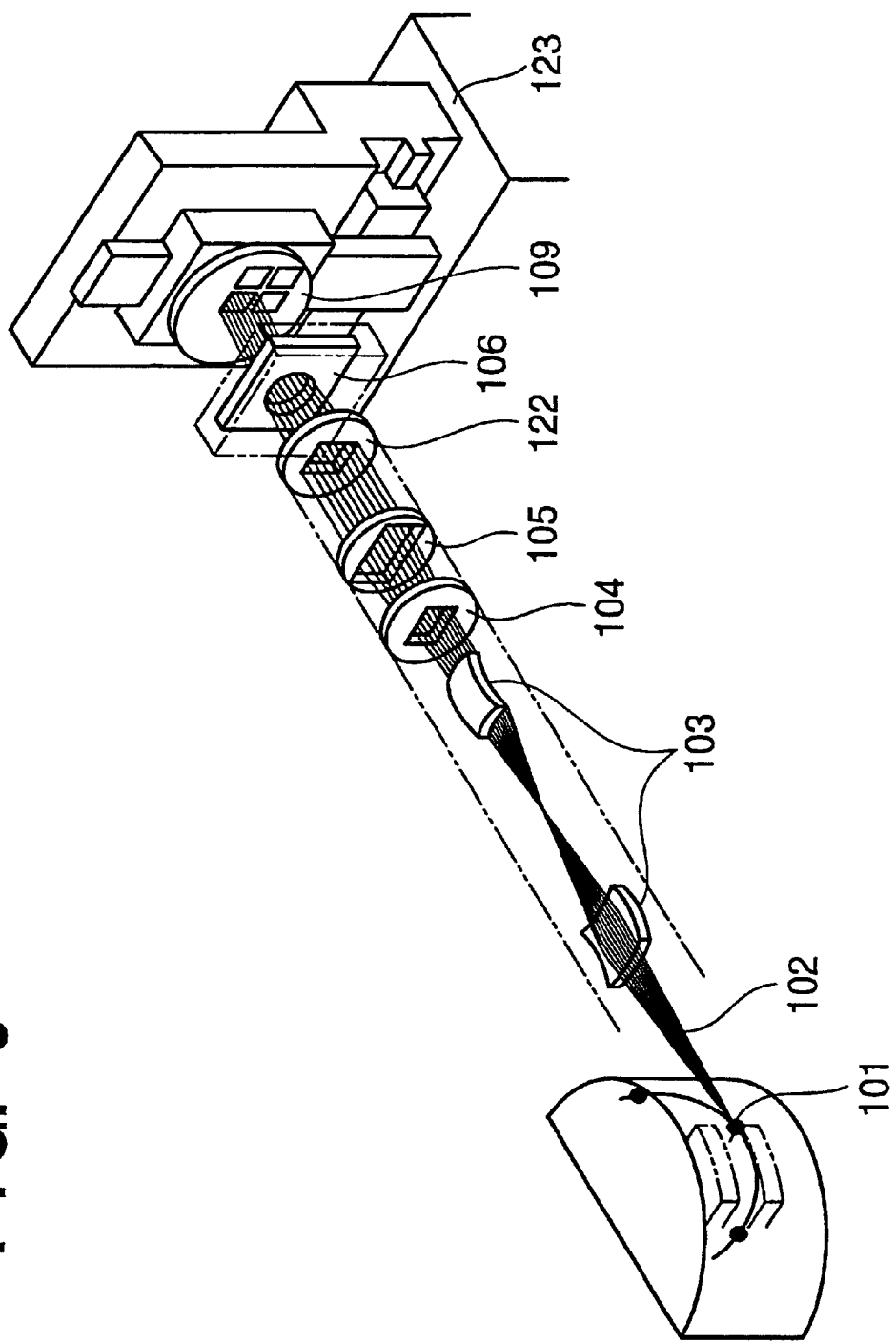
FIG. 9 is a schematic view showing the main part of a conventional X-ray exposure apparatus.

FIG. 8 is a sectional view showing the main part of the X-ray mask. FIG. 8 shows the X-ray mask 6 and an Si wafer 21 serving as a substrate. Reference numeral 22 denotes a membrane containing a material having an absorption edge in a wavelength range outside the range 0.45 to 0.7 nm.

More specifically, the membrane 22 contains at least one material selected from diamond, diamond-like carbon, boron nitride, and beryllium.

Reference numeral 23 denotes an X-ray transmission film such as an ITO film or $SiO_2$ film.

Reference numeral 24 denotes an X-ray absorber containing a material having an absorption edge in a wavelength range of 0.6 nm or more to less than 0.85 nm. Examples of this material are tungsten and a tantalum-based material.

Reference numeral 25 denotes an opening; and 26, a mask frame (frame).

Referring back to FIG. 1, the X-ray mirror 3 contains a material having an absorption edge in the wavelength range of less than 0.45 nm and the wavelength range exceeding 0.7 nm. That is, the X-ray mirror 3 is formed of a material having an absorption edge in a wavelength range outside the range 0.45 to 0.7 nm.

The X-ray mirror 3 contains at least one material selected from the group consisting of iron, cobalt, nickel, copper, manganese, chromium, and their alloys, nitrides, carbides, and borides.

The absorption edge is defined as a wavelength at which the absorption coefficient of a substance abruptly changes. The absorption coefficient is larger on the short-wavelength side, while it is smaller on the long-wavelength side. The absorption edge changes depending on substances. Note that the absorption coefficient decreases again in a shorter wavelength range away from the absorption edge.

In this embodiment, a short-wavelength cutting X-ray mirror which absorbs at least 90% of X-rays in the wavelength range of less than 0.3 nm is arranged. When X-rays in the wavelength range of less than 0.3 nm are mixed in exposure light, the adverse influence of photoelectrons generated on a semiconductor wafer cannot be neglected.

Light or synchrotron radiation 2 emitted from the synchrotron radiation source 1 is incident on the X-ray mirror 3. An angle formed by the optical axis (central axis) for the light 2 and the X-ray reflection surface is defined as an oblique incidence angle 7. An angle for converging the light 2 in the X-ray mirror 3 is represented as a convergence angle 8. The light 2 reflected by the X-ray mirror 3 reaches the semiconductor wafer 9 through the heat removal filter 4, beryllium window 5, and X-ray mask 6. The pattern of the X-ray mask 6 is formed on the semiconductor wafer 9 using this light 2. Semiconductor devices are formed on the exposed semiconductor wafer 9 by a known developing process.

An X-ray exposure method according to this embodiment comprises sending light from the synchrotron radiation source onto an X-ray mirror containing a material having an absorption edge in at least one of a wavelength range of less than 0.45 nm and a wavelength range exceeding 0.7 nm, and exposing a substrate using X-rays emerging from an optical path including the X-ray mirror.

Note that the X-ray mirror 3 may have a function as a convergence mirror for converging the light 2 and a function as a divergence mirror for increasing the area (irradiation area) of the X-ray mask 6 to be irradiated with the light from the X-ray mirror 3 at once. In the X-ray exposure apparatus of the present invention, another convergence mirror or another divergence mirror may be arranged in addition to the X-ray mirror 3.

Figure 2:
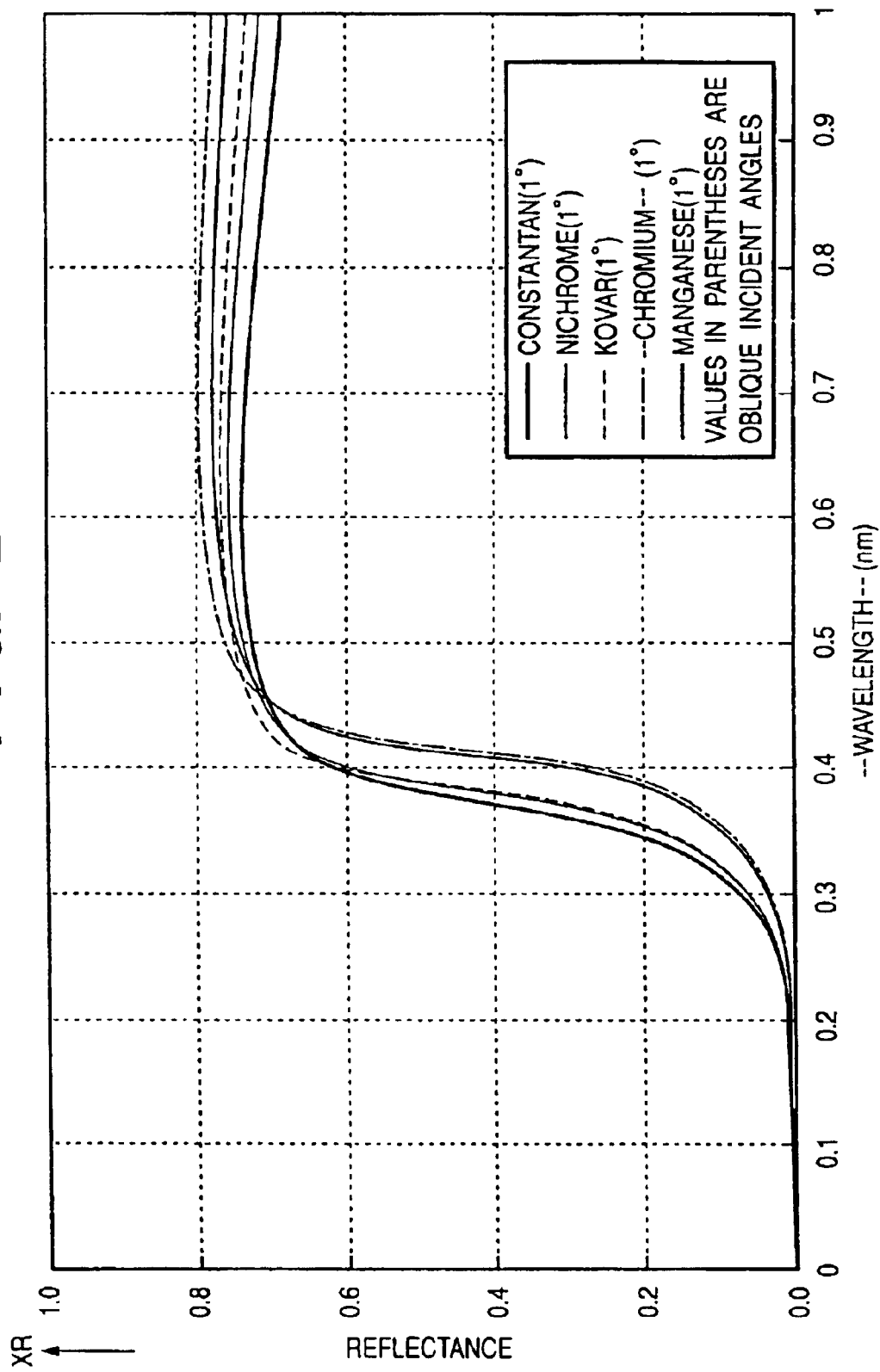
FIG. 2 is a graph showing the relationship between the X-ray wavelengths and reflectances of an X-ray mirror material of the first embodiment of the present invention and a conventional X-ray mirror material.
Figure 3:
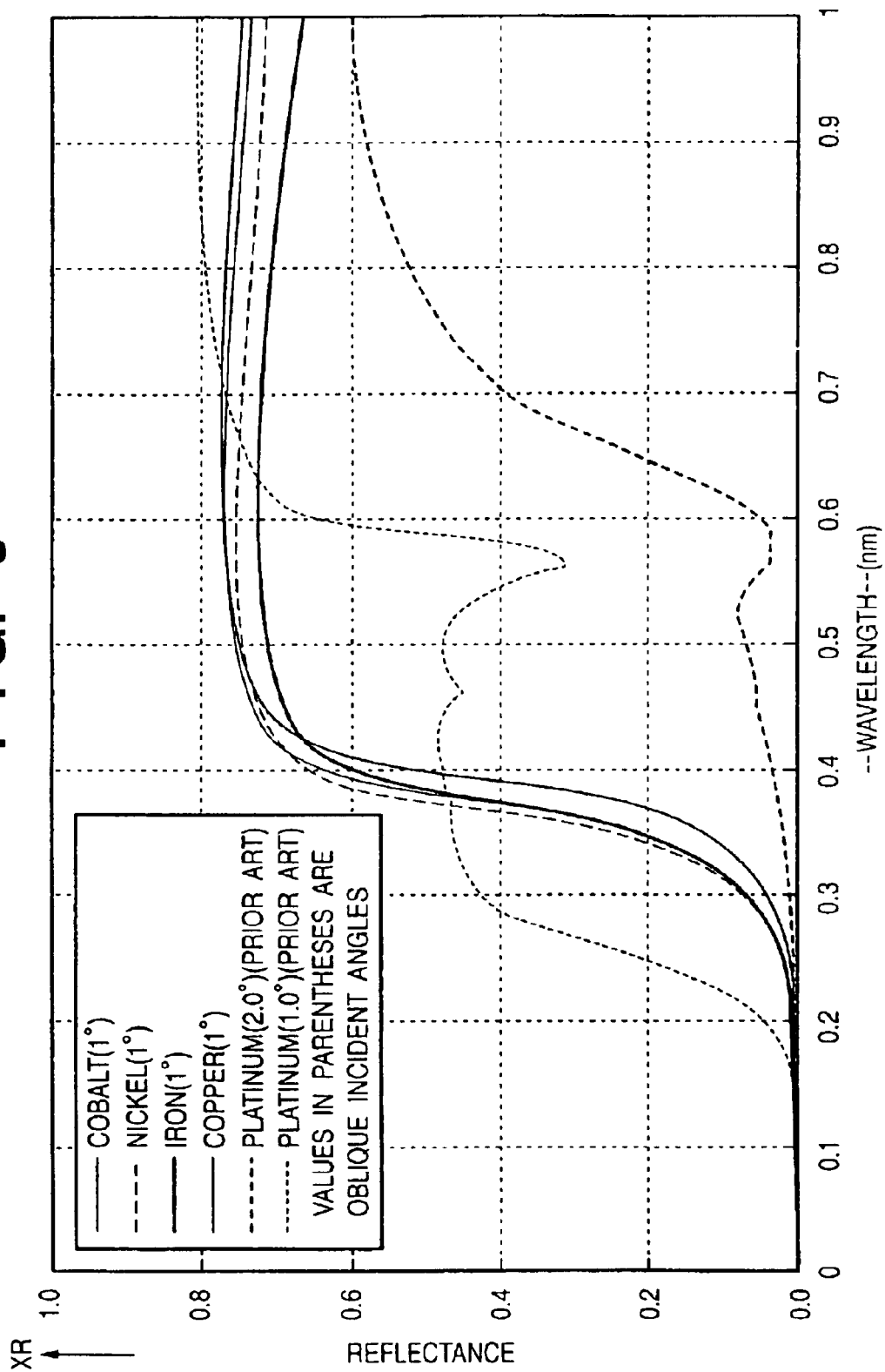
FIG. 3 is a graph showing the relationship between the X-ray wavelength and reflectance of an X-ray mirror material according to the first embodiment of the present invention.

The X-ray mirror 3 used in the X-ray exposure apparatus of this embodiment has a surface roughness of about 0.4 nm (rms) obtained by mechanically cutting and polishing cobalt. The light 2 was sent to become incident on the X-ray mirror 3 having the above structure at an oblique incidence angle of about 1°, and the X-ray reflection characteristics (characteristics for cutting X-rays in the short wavelength range) of the X-ray mirror 3 were evaluated. The results are shown in FIGS. 2 and 3. FIGS. 2 and 3 are graphs showing the relationship between the X-ray wavelengths and reflectances XR of X-ray mirror materials (to be described later).

When the material of the present invention is used, an excellent reflectance is obtained within a wavelength range of 0.4 nm or more, as shown in FIGS. 2 and 3.

The present inventors confirmed that X-rays in a shorter wavelength range than a conventional one could be used in the X-ray exposure process by appropriately selecting a material used for the X-ray mirror. Various examinations were made to implement an X-ray exposure apparatus using such X-rays in the short wavelength range. According to one of the examinations, the material of a short-wavelength cutting X-ray mirror used in a beam line for extracting X-rays optimal as exposure light in the short wavelength range from the synchrotron radiation source was examined.

The present inventors examined the X-ray reflection characteristics on the surface of various materials. As a result, even in a mirror using a heavy element such as platinum conventionally examined as the material of an X-ray mirror, the present inventors found that the wavelength range of X-rays to be cut could be shifted to the shorter wavelength side than the conventional one by reducing the oblique incidence angle. However, when platinum as a conventional material is used, the reflectance is as low as about 50% at a wavelength of 0.3 to 0.55 nm even with an oblique incidence angle of 1° (see FIG. 3).

The present inventors examined cobalt, nickel, iron, copper, chromium, and manganese as the group IV materials of the periodic table at an oblique incidence angle of 1°. As a result, these materials reflected X-rays up to the short wavelength range of about 0.4 nm with high reflectances (FIGS. 2 and 3). Similar reflectances were obtained for their alloys. For example, the reflectances of Constantan as an alloy of copper and nickel, Kovar as an ally of cobalt, nickel, and iron, and nichrome as an alloy of nickel and chromium are shown in FIG. 2. Although not shown, similar characteristics can be obtained for nitrides, carbides, and borides of cobalt, nickel, iron, copper, chromium, and manganese.

When a mirror material according to the present invention is used, exposure light can have a shorter wavelength and a higher output can be obtained as compared with a conventional X-ray exposure apparatus. This will be described below.

Assume as a conventional X-ray exposure apparatus system a system comprised of a synchrotron radiation source having a critical wavelength of 1.8 nm, two platinum X-ray mirrors, a heat removal filter, a beryllium window, and a window formed from a silicon nitride film.

The oblique incidence angles on the two platinum X-ray mirrors are 1.75° and 1.45°, respectively. The heat removal filter is made of 1-$\mu$m silicon carbide, the thickness of the beryllium window is 15 $\mu$m, and the thickness of the silicon nitride film is 1.5 $\mu$m. The X-ray spectra, i.e., X-ray irradiation spectra (relative intensities) of X-rays passing through an X-ray mask membrane made of 2-$\mu$m thick silicon carbide in the X-ray exposure apparatus using the above X-ray mirror are shown as a conventional example in FIG. 4.

An arrangement of an X-ray mirror examined by the present inventors will be described below. Assume an X-ray exposure apparatus using the mirror materials shown in FIGS. 2 and 3 and having an X-ray mirror having the same convergence angle as that of the conventional example, a heat removal filter made of 1-μm thick diamond, and a 20-μm thick beryllium window. In this arrangement, only one X-ray mirror is used.

Figure 4:
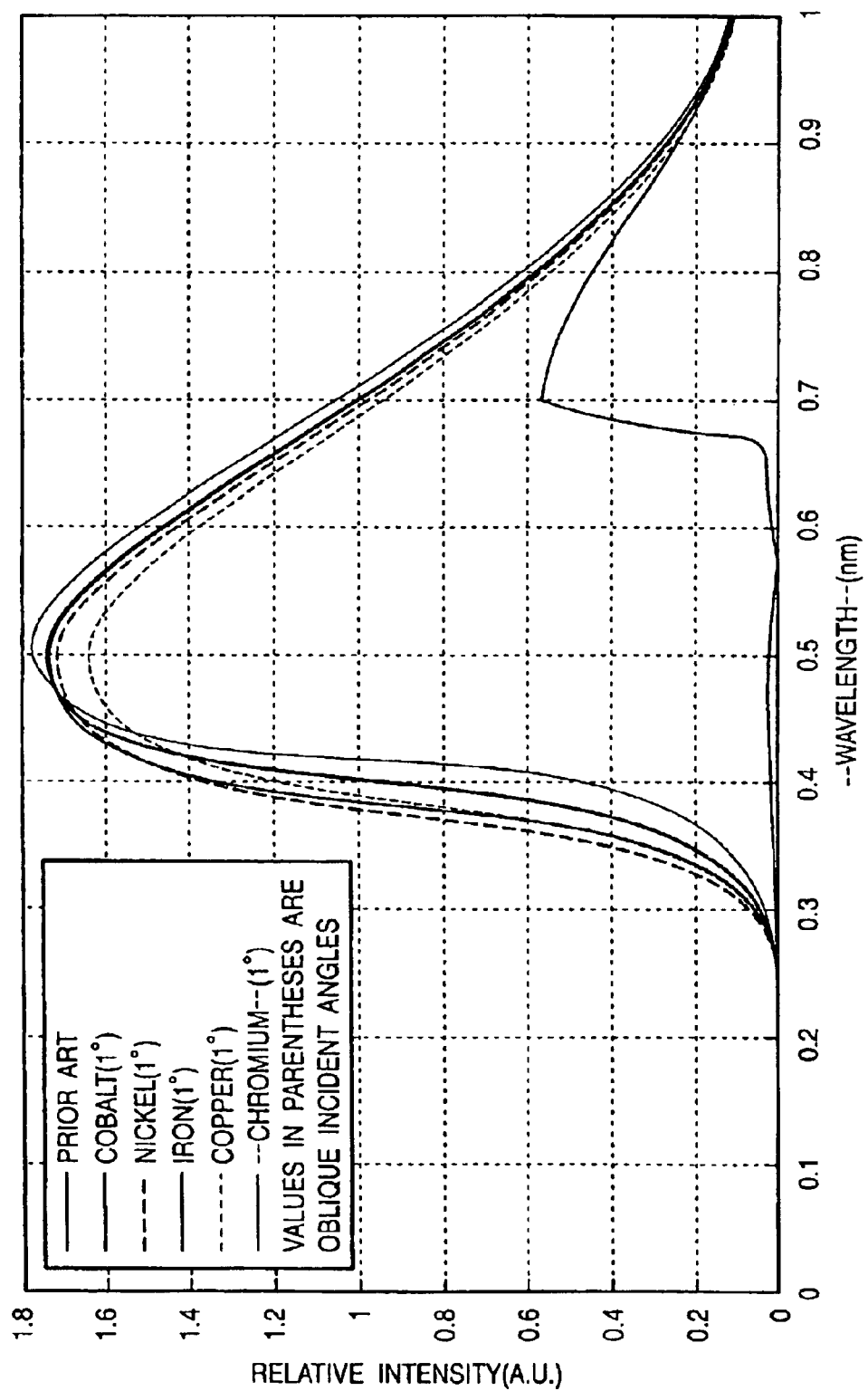
FIG. 4 is a graph showing the relationship between the X-ray wavelengths and intensities of the X-ray mirror material of the first embodiment of the present invention and a conventional X-ray mirror material.
Figure 5:
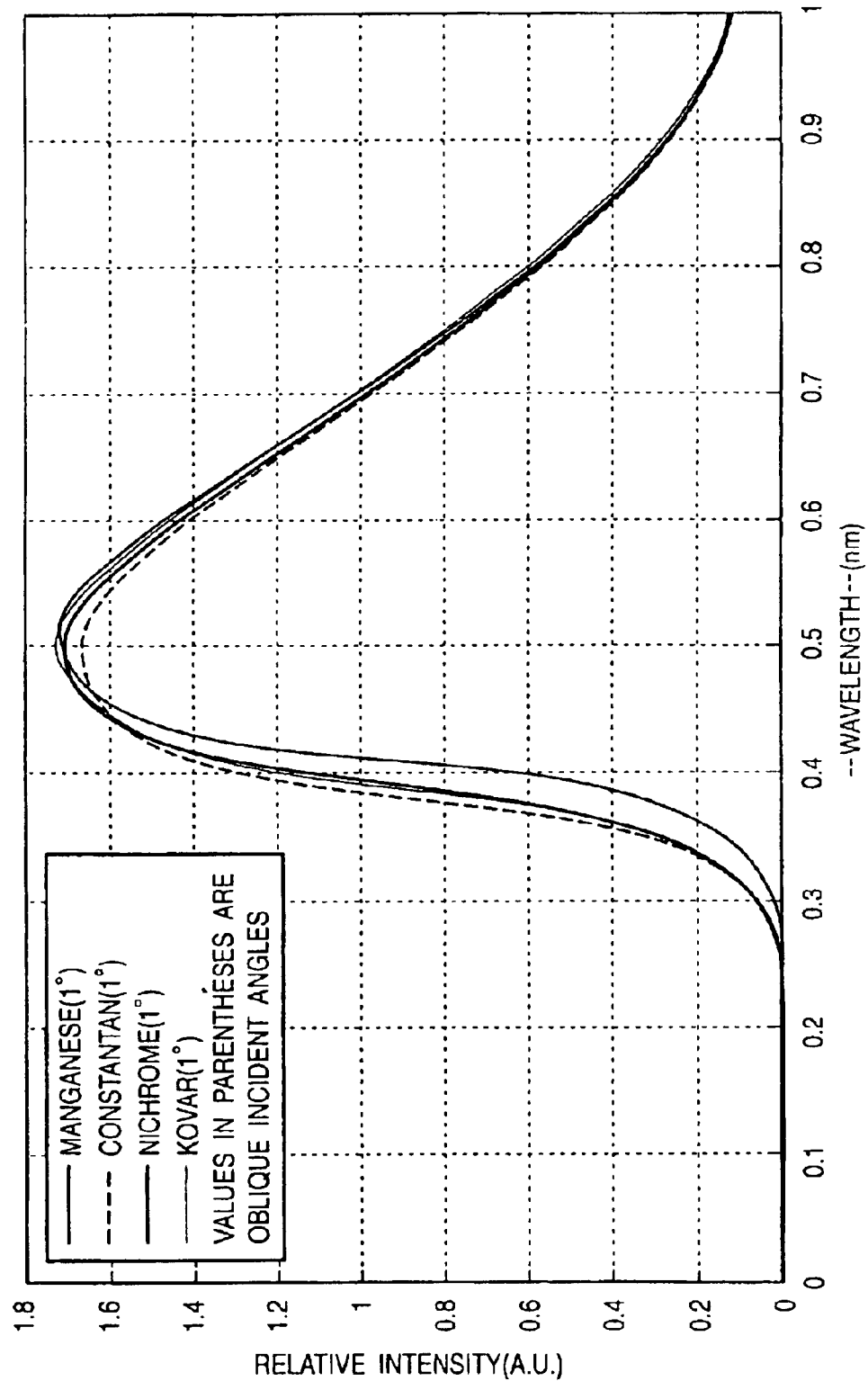
FIG. 5 is a graph showing the relationship between the X-ray wavelength and intensity of the X-ray mirror material according to the first embodiment of the present invention.

The X-ray spectra, i.e., X-ray irradiation spectra of X-rays passing through the X-ray mask membrane made of 4-μm thick diamond in the X-ray exposure apparatus having the above arrangement are shown in FIGS. 4 and 5.

As shown in FIGS. 4 and 5, according to the present invention, the irradiation intensity is 4.6 to 4.9 times the conventional example. X-rays having a peak intensity profile in the wavelength range of 0.45 to 0.7 nm can be obtained. By using X-rays having this intensity profile as exposure light, finer exposure is implemented.

Note that the material of the X-ray mask membrane is changed from silicon carbide as the conventional material to diamond due to the following reason. That is, the absorption edge of silicon carbide is near 0.65 nm, and the X-ray transmission intensity at wavelengths near 0.65 nm are greatly attenuated. Diamond having an absorption edge of 4.4 nm falling outside the exposure wavelength range is used for the X-ray mask membrane to prevent extreme attenuation of the exposure intensity.

The thickness of the X-ray membrane made of diamond is set to 4 μm because the thickness of the membrane must be large to maintain positional precision of a fine pattern.

In the X-ray exposure apparatus of the present invention, as shown in FIGS. 4 and 5, even if the synchrotron radiation source is kept unchanged, the irradiation intensity can be 4.6 to 4.9 times that obtained in the conventional X-ray exposure apparatus.

Note that, the attenuation of X-rays in a wavelength range of 0.7 nm or more in FIGS. 4 and 5 is caused by the penetration of X-rays of the heat removal filter, the beryllium window and the X-ray mask membrane in the above X-ray exposure apparatus.

(Second Embodiment)

Figure 6:
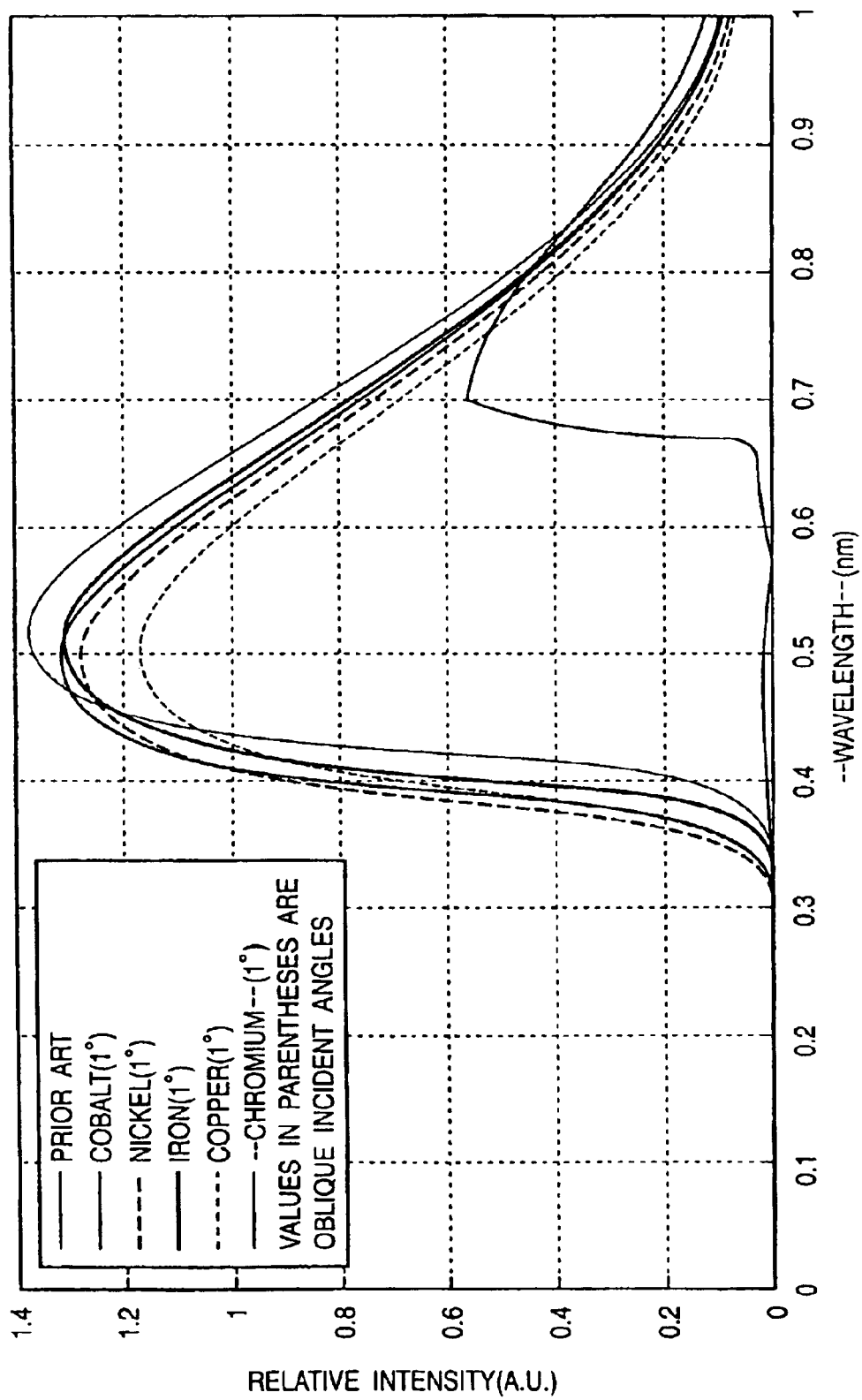
FIG. 6 is a graph showing the relationship between the X-ray wavelengths and intensities of an X-ray mirror material of the second embodiment of the present invention and a conventional X-ray mirror material.
Figure 7:
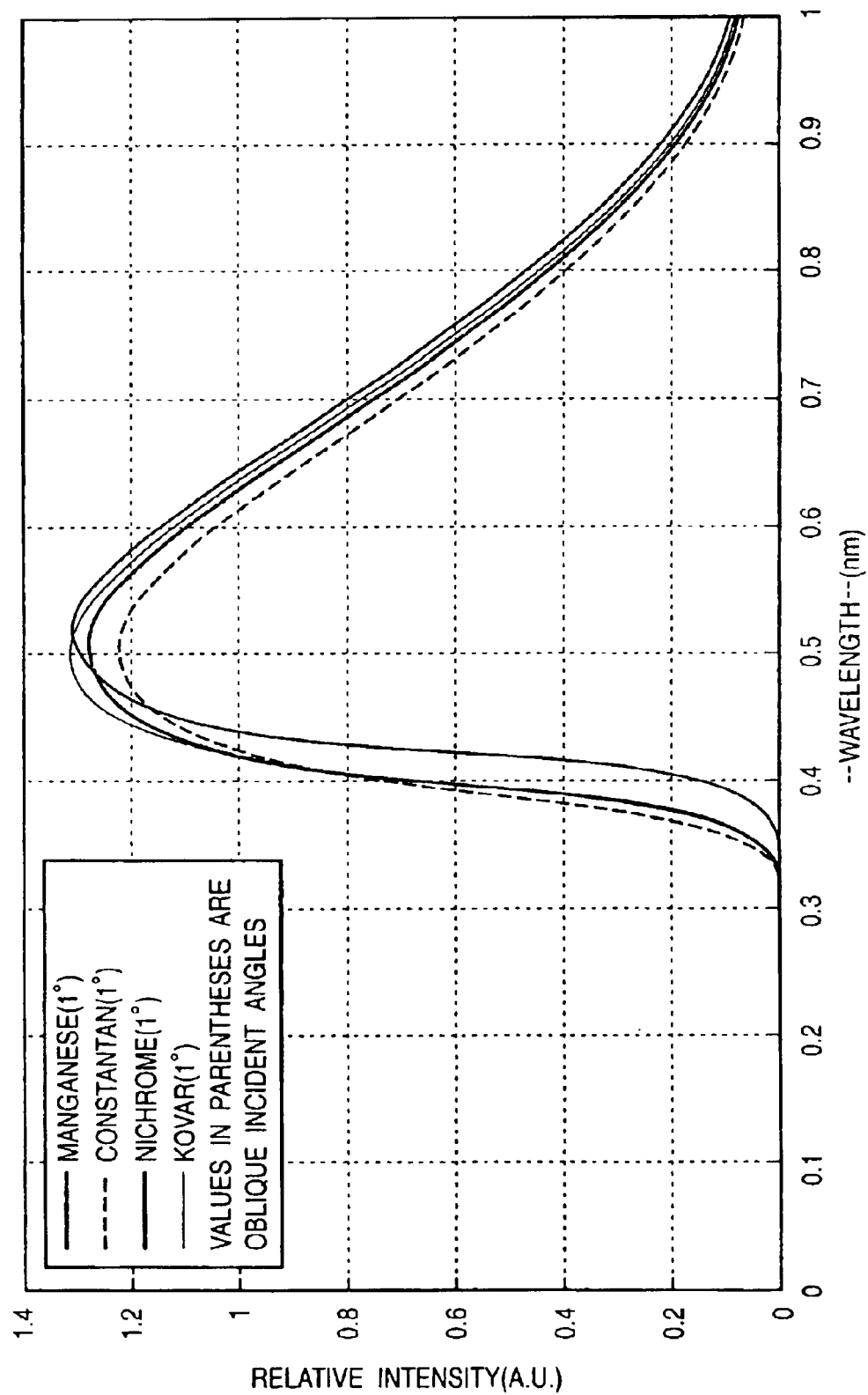
FIG. 7 is a graph showing the relationship between the X-ray wavelength and intensity of the X-ray mirror material of the second embodiment of the present invention.

Although the X-ray exposure apparatus of the first embodiment uses one X-ray mirror, a mirror arrangement using two X-ray mirrors to form a beam shape is also applicable to the present invention. The irradiation X-ray spectra obtained when two X-ray mirrors are used and the conventional mirror is used are shown in FIGS. 6 and 7. In this case, the two X-ray mirrors are held at an oblique incidence angle of 1°. As in the first embodiment, the X-ray mirrors are formed using the materials shown in FIGS. 2 and 3. In this case as well, the irradiation intensity of the X-ray exposure apparatus of the present invention can be 3.1 to 3.6 times that in the arrangement using the conventional mirror.

Features except the above embodiments according to the present invention will be described below.

The present invention incorporates an aspect pertaining to an X-ray exposure apparatus for extracting optimal X-rays as short-wavelength exposure light from a radiation source and an X-ray exposure method using such X-rays, and an aspect pertaining to a mask material using the short-wavelength light from the radiation source as exposure light.

As X-rays optimal for short-wavelength exposure, X-rays having an intensity profile with a peak in the wavelength range of 0.45 nm to 0.7 nm as shown in FIGS. 4 and 5 are used. By using X-rays in this wavelength range, high-resolution exposure processing can be achieved without adverse influences of photoelectrons. X-rays optimal for short-wavelength exposure can be extracted by appropriately selecting the material of a short-wavelength cutting oblique incidence mirror used in a beam line for extracting light from the radiation source to the exposure apparatus.

Judging from the examinations of X-ray oblique incidence reflection characteristics on the surfaces of various materials, a range for cutting short-wavelength components can be shifted to the short-wavelength side by reducing an oblique incidence angle even in a mirror using a heavy element such as gold or platinum considered even in the conventional case. However, the short-side wavelength components cannot be perfectly cut off, and X-rays in the range of 0.3 to 0.5 nm mix in exposure light in a considerable amount. Pattern formation is adversely affected by generation of photoelectrons or the like (see FIG. 3).

More specifically, the absorption edge of platinum is near 0.55 nm. As shown in FIG. 3, the reflectances in the range of 0.45 to 0.6 nm are lower than those in the range of 0.6 nm or more. The X-rays in this range cannot be effectively used. When the oblique incidence angle for platinum is 1°, the X-ray reflectances in the range of 0.3 to 0.45 nm are almost equal to those in the range of 0.45 to 0.6 nm, which indicates that X-rays in the range of 0.3 to 0.45 nm mix in a large amount. To reduce the mixing amount of X-rays in the range of 0.3 to 0.45 nm, when the incidence angle on the mirror is set to 2°, the reflectances in the range of 0.3 to 0.45 nm are certainly reduced. At the same time, the reflectances in the range of 0.45 to 0.6 nm are reduced accordingly. The reflectances in the range of 0.6 to 0.7 nm are slightly lower than those in the range of 0.7 nm or more. As a result, the X-rays in the range of 0.45 to 0.7 nm cannot be effectively used.

Since platinum has an absorption edge near 0.55 nm, the above results are obtained. As for a material having an absorption edge between 0.45 nm and 0.7 nm, the same results as described above are obtained.

When a material such as cobalt, nickel, iron, or copper in FIG. 3 is used, the above inconvenience can be eliminated. X-rays having a peak intensity profile in the range of 0.45 to 0.7 nm can be obtained. The X-ray mirror of each embodiment described above has an almost constant reflectance from the long wavelength side to 0.45 nm. Only the reflectances of X-rays in the wavelength range of less than 0.45 nm can be reduced. As described with reference to the above embodiments, X-rays having the intensity profiles shown in FIGS. 4 and 5 can be obtained.

It should be noted that the reflectance for a wavelength of less than 0.45 nm is reduced by setting the incidence angle to 1°. When the incidence angle is slightly increased larger than 1°, the reflectances for X-rays in the range of less than 0.5 nm can be reduced. When the incidence angle is further slightly increased, the reflectances of X-rays in the range of less than 0.6 nm can be reduced. When the incidence angle is set to be larger than 1°, the reflectances for X-rays in the range of less than 0.45 nm are naturally reduced as compared with the incidence angle of 1°. As a result, by adjusting the incidence angle, the mixing ratio of X-rays in the range of less than 0.45 nm can be further reduced.

FIGS. 4 and 5 show the X-ray intensity profiles obtained by the system (FIG. 1) of the above embodiment when the incidence angle of the X-ray mirror is set to 1°. As can be apparent from FIGS. 4 and 5, X-rays in the range of less than 0.45 nm slightly mix, and this mixing amount is allowable. However, this mixing amount may not be neglected depending on certain situations. In this case, an allowable amount can be obtained by changing the incidence angle as described above (by slightly increasing the incidence angle). Even in this case, it is important that the absorption edge fall outside the range of 0.45 to 0.7 nm. When the absorption edge falls within this range, the X-rays in the range of 0.45 to 0.7 nm cannot be effectively used as in the case of platinum.

As oblique incidence mirrors for exposure, conventionally, in addition to a plane mirror, a curved surface mirror such as a spherical mirror, cylindrical surface, or toroidal surface, and an aspherical mirror surface such as an ellipsoidal surface or a paraboloid are used to increase convergence efficiency. With the advent of techniques for processing mirror surfaces, evaluation techniques, and design techniques, an aspherical mirror surface which cannot be easily described by mathematical expressions can recently be examined. Techniques for processing a highly brittle material with high hardness in addition to glass materials have been developed. A free-form surface is used as a mirror surface.

In forming a micropattern using short-wavelength light, it is important to obtain a short-wavelength light. The wavelength dependence of transmission performance of a mask substrate (membrane) material also becomes an important problem. More specifically, a material containing silicon such as silicon nitride or silicon carbide serves as a preferable material with higher perfection including a defect level in practical use. However, since the absorption edge of silicon is close to 0.7 nm, and transmission performance abruptly changes near 0.7 nm, it is difficult to sufficiently enhance the characteristics as a short wavelength exposure membrane.

According to the present invention, a thin film not containing silicon, i.e., a thin film made of a light element such as a material having carbon as a major constituent, diamond, diamond-like carbon, boron nitride, and beryllium was used for the membrane. These materials did not have absorption edges falling within the exposure wavelength range of 1.5 nm or less and exhibit flat transmission characteristics. In particular, some diamond samples had a modulus of elasticity twice or more that of silicon carbide and exhibited excellent characteristics as a microregion substrate. The beryllium thin film had excellent X-ray transmission performance, but had not been examined as an X-ray proximity exposure mask substrate because it did not transmit alignment light and had a large thermal expansion coefficient.

As for the problem of a high thermal expansion coefficient, almost no temperature rise is experienced in exposure in a large-area cell projection like flash exposure in an exposure atmosphere with good heat dissipation such as a reduced-pressure helium atmosphere, which is under development. In particular, the above problem was negligible in a system using a heat wave absorption diamond window or beryllium window.

The above materials could be obviously used in short-wavelength exposure using global alignment as the mainstream. Boron nitride was better than the beryllium film in view of hardness and thermal expansion. It was difficult to form a boron nitride film transparent to alignment light. However, this material was reexamined because alignment is allowed due to global alignment and a high-precision stage. As a result, it was found to be an excellent material having no absorption edge in the exposure light range of 0.45 to 0.7 nm indispensable in short-wavelength exposure. That is, boron nitride was confirmed as a very useful material in a short-wavelength selective exposure system such as an X-ray mirror of this embodiment.

In the X-ray proximity exposure techniques, a heavy metal, and its compound and alloy are proposed as X-ray absorbers for masks (24 in FIG. 8). In short-wavelength exposure of this embodiment, the absorber has a wavelength band with a high absorption capability for tungsten or a tantalum-based material conventionally used. The absorber can properly absorb X-rays and allows excellent exposure. When an absorber is formed from a multilayered film, the reflectance for X-rays can be increased and the aspect ratio of the absorber can be reduced.

The surface of a material described with reference to FIGS. 2 and 3 is used as the short-wavelength cutting oblique incidence mirror. Light which as a peak wavelength in a shorter wavelength range of 0.45 to 0.7 nm than the wavelength of 0.75 nm having been regarded as the conventional optimal exposure wavelength, contains a smaller content of short-wavelength light components, and can be used for short-wavelength X-ray proximity exposure, which can be extracted using such a material, thereby performing X-ray lithography.

In addition, a method of forming such mirror materials on substrates is developed to form a larger mirror, thereby implementing an exposure system having a high convergence efficiency and high throughput. To enhance the features of this short-wavelength X-ray proximity exposure system, a thin film of diamond, diamond-like carbon, boron nitride, or beryllium as the material of the mask membrane was used to develop an excellent X-ray mask for short-wavelength X-ray proximity exposure, as described above. Without using a conventional bored stencil mask, light in the short wavelength range of 0.45 to 0.7 nm can be used as exposure light in X-ray proximity exposure.

According to the present invention, X-rays in a shorter wavelength range than the conventional one can be obtained using appropriate members to implement an X-ray exposure apparatus and method capable of obtaining a higher-resolution pattern, and a device manufacturing method using the X-ray exposure apparatus and method.

In addition, according to the present invention, there is implemented an X-ray exposure system capable of using X-rays in a shorter wavelength range than the conventional wavelength, increasing the irradiation intensity, and facilitating a high throughput in order to obtain a higher-resolution pattern.

As many apparently widely different embodiments of the present invention can be made without departing from the spirit and scope thereof, it is to be understood that the invention is not limited to the specific embodiments thereof except as defined in the appended claims.

What is claimed is:

1. An X-ray exposure apparatus comprising:
   an exposure unit for exposing a substrate using X-rays, said exposure unit comprising an X-ray mirror to obtain the X-rays from light output from a radiation source,
   wherein the X-ray mirror contains a material having an absorption edge in a wavelength range outside a range of 0.45 nm to 0.7 nm, the X-ray mirror contains at least one material selected from the group consisting of iron, cobalt, nickel, copper, manganese, chromium, and an alloy, a nitride, a carbide and a boride thereof, and said exposure unit comprises a short-wavelength cutting X-ray mirror for absorbing at least 90% of X-rays in a wavelength range of less than 0.3 nm.

2. The apparatus according to claim 1, further comprising a synchrotron radiation source for emitting the light.

3. The apparatus according to claim 1, wherein
   said exposure unit exposes the substrate through an X-ray mask,
   the X-ray mask includes a membrane and an X-ray absorber formed on the membrane, and
   the membrane contains a material having an absorption edge in the wavelength range outside the range 0.45 nm to 0.7 nm.

4. The apparatus according to claim 3, wherein the membrane contains at least one material selected from the group consisting of diamond, diamond-like carbon, boron nitride, and beryllium.

5. The apparatus according to claim 3, wherein the X-ray absorber contains a material having an absorption edge in a wavelength range of 0.6 nm (inclusive) to 0.85 nm (inclusive).

6. The apparatus according to claim 5, wherein the X-ray absorber contains a material selected from the group consisting of tungsten and a tantalum-based material.

7. A device manufacturing apparatus for manufacturing a device using the X-ray exposure apparatus of claim 1.

8. An X-ray exposure method comprising the steps of:
   obtaining X-rays from light output from a radiation source; and
   exposing a substrate using the X-rays obtained through an optical path,
   wherein the obtaining step includes a step of sending the light onto an X-ray mirror system containing a material having an absorption edge in a wavelength range outside a range of 0.45 nm to 0.7 nm, the X-ray mirror system contains at least one material selected from the group consisting of iron, cobalt, nickel, copper, manganese, chromium, and an alloy, a nitride, a carbide, and a boride thereof, and the X-ray mirror system absorbs at least 90% of X-rays in a wavelength range of less than 0.3 nm.

9. The method according to claim 8, wherein a synchrotron radiation source is used as the radiation source.

10. The method according to claim 8, wherein:
    in the exposing step, the substrate is exposed using an X-ray mask,
    the X-ray mask includes a membrane and an X-ray absorber formed on the membrane, and
    the membrane contains a material having an absorption edge in the wavelength range outside the range of 0.45 nm to 0.7 nm.

11. The method according to claim 10, wherein the membrane contains at least one material selected from the group consisting of diamond, diamond-like carbon, boron nitride, and beryllium.

12. The method according to claim 10, wherein the X-ray absorber contains a material having an absorption edge in a wavelength range of 0.6 nm (inclusive) to 0.85 nm (inclusive).

13. The method according to claim 12, wherein the X-ray absorber contains a material selected from the group consisting of tungsten and a tantalum-based material.

14. A microstructure manufactured using the X-ray exposure method of claim 8.

15. An X-ray mirror containing:
    a material having an absorption edge in a wavelength range outside a range of 0.45 nm to 0.7 nm, said material containing at least one material selected from the group consisting of iron, cobalt, nickel, copper, manganese, chromium, and an alloy, a nitride, a carbide and a boride thereof,
    wherein said X-ray mirror absorbs at least 90% of X-rays in a wavelength range of less than 0.3 nm.

16. An X-ray exposure apparatus comprising:
    an X-ray mirror for reflecting X-rays from a radiation source, said X-ray mirror containing a material having an absorption edge in a wavelength range outside a range of 0.45 nm to 0.7 nm, and containing at least one material selected from the group consisting of iron, cobalt, nickel, copper, manganese, chromium, and an alloy, a nitride, a carbide and a boride thereof,
    wherein said X-ray mirror absorbs at least 90% of X-rays in a wavelength range of less than 0.3 nm.

* * * * *

UNITED STATES PATENT AND TRADEMARK OFFICE
CERTIFICATE OF CORRECTION

| | | |
|---|---|---|
| PATENT NO. | : 6,947,519 B2 | Page 1 of 1 |
| APPLICATION NO. | : 09/951456 | |
| DATED | : September 20, 2005 | |
| INVENTOR(S) | : Kenji Itoga et al. | |

It is certified that error appears in the above-identified patent and that said Letters Patent is hereby corrected as shown below:

ON THE COVER PAGE:
    In item "(56) References Cited," under "FOREIGN PATENT DOCUMENTS," the first-listed document, "EP 0 597 644 A2 11/1993" should read -- EP 0 597 664 A2 11/1993 --.
    In item "(56) References Cited," under "OTHER PUBLICATIONS," insert the following:

-- Bearden, et al. Reviews in Modem Physics, v. 39, 1967 [on line][retrieved on January 11, 2002]. Retrieved from http://www-structure.llnl.gov/Xray/elements.Htm. --

COLUMN 2:
    Line 43, "very" should be deleted.

COLUMN 8:
    Line 38, "ally" should read -- alloy --.

COLUMN 9:
    Line 17, "are" should read -- is --.

COLUMN 11:
    Line 22, "short wavelength" should read -- short-wavelength --.

COLUMN 12:
    Line 22, "short wavelength" should read -- short-wavelength --.

Signed and Sealed this

Eighteenth Day of September, 2007

JON W. DUDAS
*Director of the United States Patent and Trademark Office*